US012762316B2

(12) United States Patent
Korotky-Adamenko et al.

(10) Patent No.: US 12,762,316 B2
(45) Date of Patent: Oct. 13, 2026

(54) PLATFORM FOR NON-VOLATILE MEMORY STORAGE DEVICES SIMULATION

(71) Applicant: SK hynix Inc., Gyeonggi-do (KR)

(72) Inventors: Valentin Korotky-Adamenko, Minsk (BY); Igor Novogran, Minsk (BY)

(73) Assignee: SK hynix Inc., Gyeonggi-do (KR)

( * ) Notice: Subject to any disclaimer, the term of this patent is extended or adjusted under 35 U.S.C. 154(b) by 791 days.

(21) Appl. No.: 17/703,970

(22) Filed: Mar. 24, 2022

(65) Prior Publication Data

US 2023/0305734 A1 Sep. 28, 2023

(51) Int. Cl.
*G06F 30/33* (2020.01)
*G06F 30/3308* (2020.01)

(52) U.S. Cl.
CPC ................................ *G06F 30/3308* (2020.01)

(58) Field of Classification Search
CPC .. G06F 30/3308; G06F 30/33; G06F 11/3457; G06F 11/0712
See application file for complete search history.

(56) References Cited

U.S. PATENT DOCUMENTS 8,874,966 B1 10/2014 Garrett, Jr. et al.
8,984,101 B1 * 3/2015 Viswanath .......... H04L 67/1008 709/223
11,222,152 B2 * 1/2022 Schnurr ................ G06F 9/5066
2005/0091026 A1 * 4/2005 Hodgson ................. G06F 30/33 703/22
2006/0106861 A1 5/2006 Torgerson et al.
2007/0256053 A1 * 11/2007 Torgerson ................. G06F 8/38 717/110
2009/0089029 A1 * 4/2009 Sturrock ................. G06F 30/20 703/7
2010/0217573 A1 * 8/2010 Hatcherson ............. G06F 30/20 703/6
2015/0154038 A1 6/2015 Ahmed et al.
2017/0162168 A1 * 6/2017 Lopez .................... G09G 5/006
(Continued)

FOREIGN PATENT DOCUMENTS

CN 101133392 A 2/2008
CN 105005658 A 10/2015
(Continued)

OTHER PUBLICATIONS

"A Web-based Distributed Network Simulation Framework using CORBA IDL-based APIs" by Arjun Cholkar (Year: 2000).*
(Continued)

*Primary Examiner* — Emerson C Puente
*Assistant Examiner* — Yi Hao
(74) *Attorney, Agent, or Firm* — IP & T GROUP LLP

(57) ABSTRACT

A system and associated method for simulating a storage device. In the system and method, a set of simulation entities (SEs) is provided including a host SE and storage component SEs corresponding to hardware and software components of the storage device to be simulated, SEs from the set of the SEs are selected, a logical relationship is determined between the selected SEs, sequential messages are propagated between the selected SEs and to the simulation core engine which determine whether conditions for a simulation are complete, and simulations are performed using the selected SEs.

18 Claims, 10 Drawing Sheets

(56) References Cited

U.S. PATENT DOCUMENTS

| | | | | |
|---|---|---|---|---|
| 2019/0235994 | A1* | 8/2019 | Epperlein | G06F 11/3696 |
| 2020/0089598 | A1* | 3/2020 | Badrou | G06F 11/3698 |
| 2022/0066904 | A1* | 3/2022 | Hadas | G06F 30/20 |
| 2022/0382487 | A1* | 12/2022 | Palmer | G06F 3/0604 |

FOREIGN PATENT DOCUMENTS

| | | | |
|---|---|---|---|
| CN | 110931075 | A | 3/2020 |
| CN | 112395146 | A | 2/2021 |

OTHER PUBLICATIONS

A. Cholkar, “A Web-based Distributed Network Simulation Framework using CORBA IDL-based APIs”, published in 2000 (Year: 2000).*

Elbery (“An Integrated Architecture for Simulation and Modeling,” Smartgreens 2015 and Vehits 2015, CCIS 579, pp. 282-303, 2015. DOI: 10.1007/978-3-319-27753-0_16 (Year: 2015).*

Gouk (“Amber: Enabling Precise Full-System Simulation with Detailed Modeling of All SSD Resources,” 2018 51st Annual IEEE/ACM International Symposium on Microarchitecture (Year: 2018).*

Tavakkol A et al., MQSim: A Framework for Enabling Realistic Studies of Modern Multi-Queue SSD Devices, 2018, pp. 49-65, 16th USENIX Conference on File and Storage Technologies, USENIX Association, Oakland, CA, USA.

Gouk D et al., Amber: Enabling Precise Full-System Simulation with Detailed Modeling of All SSD Resources, 2018, 51st Annual IEEE/ACM International Symposium on Microarchitecture (MICRO).

Office Action for Chinese Patent Application No. 202211001184.4 issued by the Chinese Patent Office on Mar. 27, 2026.

Office Action for Chinese Patent Application No. 202211001184.4 issued by the Chinese Patent Office on Aug. 28, 2026.

* cited by examiner

PLATFORM FOR NON-VOLATILE MEMORY STORAGE DEVICES SIMULATION

BACKGROUND

1. Field

Embodiments of the present disclosure relate to a platform for storage devices simulation.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having a memory device(s), that is, a data storage device(s). The data storage device is used as a main memory device or an auxiliary memory device of the portable electronic devices.

Memory systems using memory devices provide excellent stability, durability, high information access speed, and low power consumption, since the memory devices have no moving parts. Examples of memory systems having such advantages include universal serial bus (USB) memory devices, memory cards having various interfaces such as a universal flash storage (UFS), and solid state drives (SSDs). Memory systems may be tested using various test tools including simulation.

SUMMARY

In one aspect of the present invention, a simulation system is provided which includes a set of simulation entities (SEs) including a host SE and storage component SEs corresponding to hardware and software components of a storage device to be simulated, a relation manager processor configured to determine a logical relationship between selected SEs from the set of the SEs, and a simulation core engine configured to perform simulations using the selected SEs. Sequential messages are propagated between the selected SEs and to the simulation core engine which determine whether conditions for a simulation are complete.

In another aspect of the present invention, a method for simulating a storage device is provided. The method provides a set of simulation entities (SEs) including a host SE and storage component SEs corresponding to hardware and software components of the storage device to be simulated, selects SEs from the set of the SEs, determines a logical relationship between the selected SEs, propagates sequential messages between the selected SEs and to the simulation core engine which determine whether conditions for a simulation are complete, and performs simulations using the selected SEs.

Additional aspects of the present invention will become apparent from the following description.

DETAILED DESCRIPTION

Figure 1:
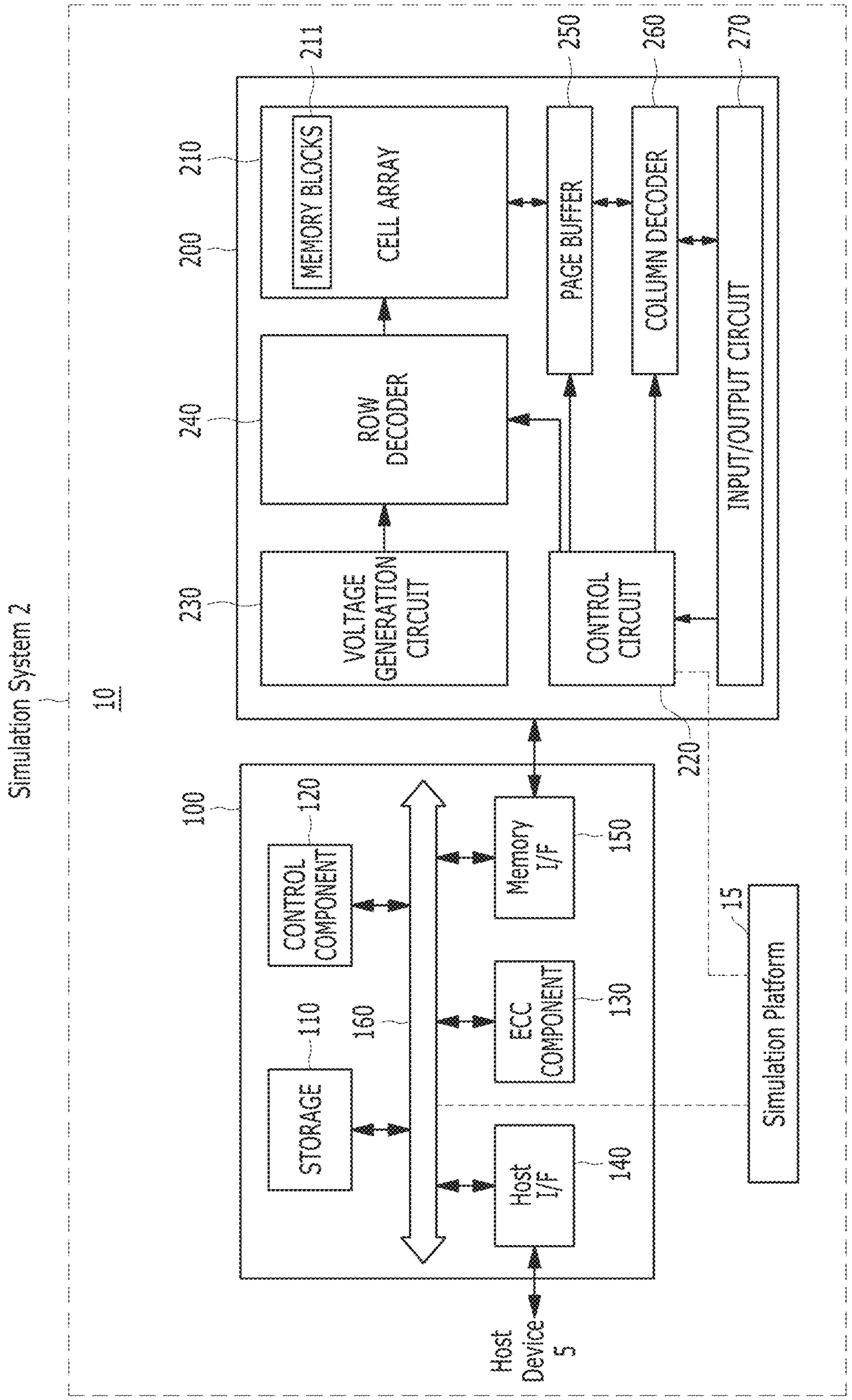
FIG. 1 is a block diagram illustrating a simulation system optionally in communication with a memory system in accordance with one embodiment of the present invention.

Various embodiments of the present invention are described below in more detail with reference to the accompanying drawings. The present invention may, however, be embodied in different forms and thus should not be construed as limited to the embodiments set forth herein. Rather, these embodiments are provided so that this disclosure conveys the scope of the present invention to those skilled in the art. Moreover, reference herein to "an embodiment," "another embodiment," or the like is not necessarily to only one embodiment, and different references to any such phrase are not necessarily to the same embodiment(s). The term "embodiments" as used herein does not necessarily refer to all embodiments. Throughout the disclosure, like reference numerals refer to like parts in the figures and embodiments of the present invention.

The present invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the present invention may take, may be referred to as techniques. In general, the order of the operations of disclosed processes may be altered within the scope of the present invention. Unless stated otherwise, a component such as a processor or a memory described as being suitable for performing a task may be implemented as a general device or circuit component that is configured or otherwise programmed to perform the task at a given time or as a specific device or circuit component that is manufactured to perform the task. As used herein, the term 'processor' or the like refers to one or more devices, circuits, and/or processing cores suitable for processing data, such as computer program instructions.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described herein, the code or instructions for implementing the operations of the method embodiments may transform the computer, processor, controller, or other signal processing device into a special-purpose processor for performing methods herein.

When implemented in software, the memory (or other storage devices), controllers, processors, devices, modules, units, multiplexers, generators, logic, interfaces, decoders, drivers, generators and other signal generators and signal processors shown in the drawings (unless otherwise denoted) comprise simulation entities SEs (i.e., software code) that simulate activities and behavior of those components. Since the present invention relates to software simulation, no actual hardware is needed although (in one embodiment) input parameters for the simulations may be provided by actual hardware devices. Accordingly, the system components depicted in the accompanying drawings refer to program code parts used for the simulations. For example, to estimate the performance of a solid state drive SSD, software based models of the particular component product parts of the SSD (memory, CPU, firmware, host controller and even the operational system) can be created. Such models simulate the activities of the named parts. That is, in one embodiment of the present invention, the models investigate the impact of parametric variations on characteristics/metrics (such as for example performance or power consumption) of the simulated component. For more detailed simulations, the components can be represented by more SEs to simulate the processes more exactly. The software models do not need an actual (physical) device for operation.

A detailed description of embodiments of the present invention is provided below along with accompanying figures that illustrate aspects of the present invention. The present invention is described in connection with such embodiments, but the present invention is not limited to any specific embodiment. The present invention encompasses numerous alternatives, modifications and equivalents. Numerous specific details are set forth in the following description in order to provide a thorough understanding of the present invention. These details are provided for the purpose of example; the present invention may be practiced according to the claims without some or all of these specific details. For clarity, technical material that is known in technical fields related to the present invention has not been described in detail so that the present invention is not unnecessarily obscured.

Non-volatile memory storage device based for example on NAND Flash memory (e.g., SSD) is a complex system where Hardware (HW) and Firmware (FW) interact together. Final storage device characteristics (e.g., performance (latency and throughput), reliability, etc.) depend on designed HW components, implemented FW algorithms and their parameters. Taking into account the variability in customer requirements and target workloads, storage device tuning is becoming an important part of the product development process.

The tuning for real storage devices adds a considerable time overhead to the development process and allocates many resources, especially for drive end-of-life conditions. One of the possible solutions to reduce this overhead is to use simulation models of a storage device for example for what-if analysis, tuning, bottleneck search, and an algorithm verification. Simulation in theory should reduce the time needed to “tune” storage device prototypes and can provide a cost-effective solution for predicting storage device characteristics and for verifying FW algorithms and prototype changes.

As both HW and FW layers are contributors of storage device characteristics, in one embodiment of the present invention, both HW and FW component can be simulated not only at the early product development design stage but also at the later stages in the product design to find weak points and improvements of FW algorithms, and may even be used with measurements from actual products to tune the simulation settings and/or to discover possible performance issues especially during product development.

Hardware and Firmware Components

Figure 4:
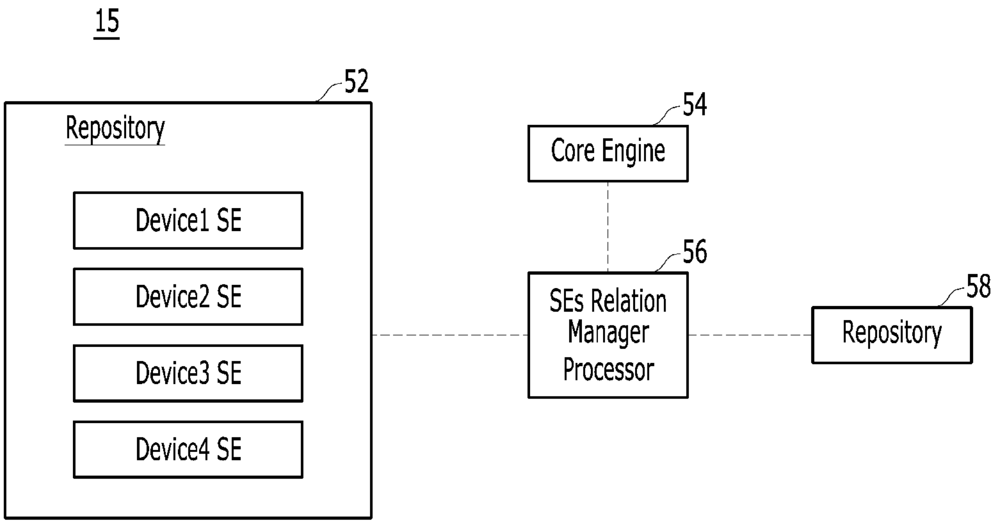
FIG. 4 is a diagram illustrating a stand alone simulation platform in accordance with another embodiment of the present invention.

FIG. 1 is a block diagram illustrating a simulation platform in accordance with one embodiment of the present invention. Referring to FIG. 1, simulation platform 15 (optionally but not necessarily) is in communication with components of memory system 10, as shown by the dashed lines extending from simulation platform toward various device components. Otherwise, simulation platform may be a separate stand-alone software platform as shown in FIG. 4 which can model the performance of the devices shown in FIG. 1.

In general, simulation platform 15 provides for computer simulation utilizing a computer program that models the behaviour of a physical system (such as for example a storage device) over time. For example, a simulation in one embodiment of the present invention could model read threshold voltages over time or could model how often garbage collection would be needed for memory system 10. Program variables (state variables) represent the current or initial state of a physical system at the beginning of a simulation. For example, a simulation in one embodiment of the present invention could have program variables representing the number of memory blocks or buffers available for reading and writing data. A simulation program in general modifies state variables to predict the evolution of the physical system over time. In one embodiment of the present invention, a simulation SE is the program code of a mathematical algorithm representing the functions of an object of interest, with the code being executed by a core simulator. Various simulation entities utilized in the present invention are detailed below. An attribute of the simulation entity (such as for example the size of the memory or the type of memory) can be included in the model’s definition of the SE. An activity of one or more SEs can be simulated.

There are several attributes of simulation platform 15. In performance of a simulation, the simulation is preferably faster and less complex than an actual operation performed on a real semiconductor memory system. Regarding scalability, any simulated HW/FW component preferably may be added/removed or replaced with other version(s) without affecting the remaining simulated components. In this aspect, the SEs are independent of each other, permitting the SEs to interact with each other. This scalability permits simulation platform to support different products and test different versions of FW algorithms accurately. Regarding configurability, the value(s) of any simulated HW/FW component parameter is changeable before running a simulation. This configurability permits storage drive tuning for specific requirements.

The present invention has been realized based on recognizing that existing simulators like MQSim and Amber are based on simulations of the whole (or are based on very detailed simulations for specific purposes) and are either too detailed or too simple to meet the preferences noted above, and therefore have limited applicability especially for metrics estimations based on product development demand.

In the following descriptions, the attributes and activities of the simulation platform 15 serving as a software-based engine for simulating the actions of components in a semiconductor memory system will be described in detail. These attributes and activities reflect those of simulation entities SEs of real devices such as memory system 10 involved in the simulation. Since the simulation entities simulate performance related to behaviour for a particular component, descriptions of the functions of memory system 10 (and their constituent components) are provided below with an understanding that the SEs (in one embodiment of the present invention) evaluate processes which impact (or probably impact) performance characteristics of those components.

Memory system 10 as a memory system SE may be implemented with any of various types of storage devices such as a solid state drive (SSD) and a memory card. In various embodiments, in the simulations of memory system 10, memory system 10 may be one of various components in an electronic device such as for example a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, and/or one of various components of a computing system.

In the simulations of memory system 10, memory system 10 may include a memory controller 100 being simulated and a semiconductor memory device 200 being simulated. The memory controller 100 may control overall operations of the semiconductor memory device 200.

In the simulations, the semiconductor memory device 200 may perform one or more erase, program, and read operations under the control of the memory controller 100. The semiconductor memory device 200 may receive through input/output lines a command CMD, an address ADDR, and data DATA. The semiconductor memory device 200 may receive power PWR through a power line and a control signal CTRL through a control line. The control signal CTRL may include for example a command latch enable signal, an address latch enable signal, a chip enable signal, a write enable signal, a read enable signal, as well as other operational signals depending on design and configuration of the memory system 10. In the simulations, the memory controller 100 and the semiconductor memory device 200 may be a single semiconductor device such as a solid state drive (SSD). The SSD may include a storage device for storing data therein. When the semiconductor memory system 10 is used in or modelled as an SSD, operation speed of a host device (e.g., host device 5 of FIG. 1) coupled to the memory system 10 may improve.

The memory controller 100 and the semiconductor memory device 200 in the simulations may be a single semiconductor device such as a memory card. For example, the memory controller 100 and the semiconductor memory device 200 may be a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Referring to back to FIG. 1, in the simulations, memory device 200 may store data to be accessed by a host device. The memory device 200 may be a volatile memory device such as for example a dynamic random access memory (DRAM) and/or a static random access memory (SRAM) or a non-volatile memory device such as for example a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 in the simulations may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 in the simulations may include a storage 110, a control component 120 which may be implemented as a processor such as for example a central processing unit (CPU), an error correction code (ECC) component 130, a host interface (I/F) 140 and a memory interface (I/F) 150, which are coupled through a bus 160.

The storage 110 in the simulations may serve as a working memory of the memory system 10 and the controller 100, and storage 110 may store data for driving the memory system 10 and the controller 100. When the controller 100 controls operations of the memory device 200, the storage 110 may store data used by the controller 100 and the memory device 200 for such operations as read, write, program and erase operations.

The storage 110 in the simulations may be a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 in the simulations may control general operations of the memory system 10, and a write operation or a read operation for the memory device 200 in response to a write request or a read request from the host device. The control component 120 may drive firmware or other program instructions, which can be referred to as a flash translation layer (FTL), to control operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 in the simulations may detect and correct errors in the data read from the memory device 200 during a read operation. In one embodiment, the ECC component 130 may not correct error bits when the number of the error bits is greater than or equal to a threshold number of correctable error bits, but instead may output an error correction fail signal indicating failure in correcting the error bits.

The ECC component 130 in the simulations may perform an error correction operation based on a coded modulation such as for example a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices suitable for error correction operation.

The host interface 140 in the simulations may communicate with the host device through one or more of various communication standards or interfaces such as for example a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 in the simulations may provide an interface between the controller 100 and the memory device 200 to allow the controller 100 to control the memory device 200 in response to a request from the host device. The memory interface 150 may generate control signals for the memory device 200 and process data under the control of the control component 120. In one embodiment where the memory device 200 is a flash memory such as a NAND flash memory, the memory interface 150 may generate control signals for the memory and process data under the control of the control component 120.

Figure 2:
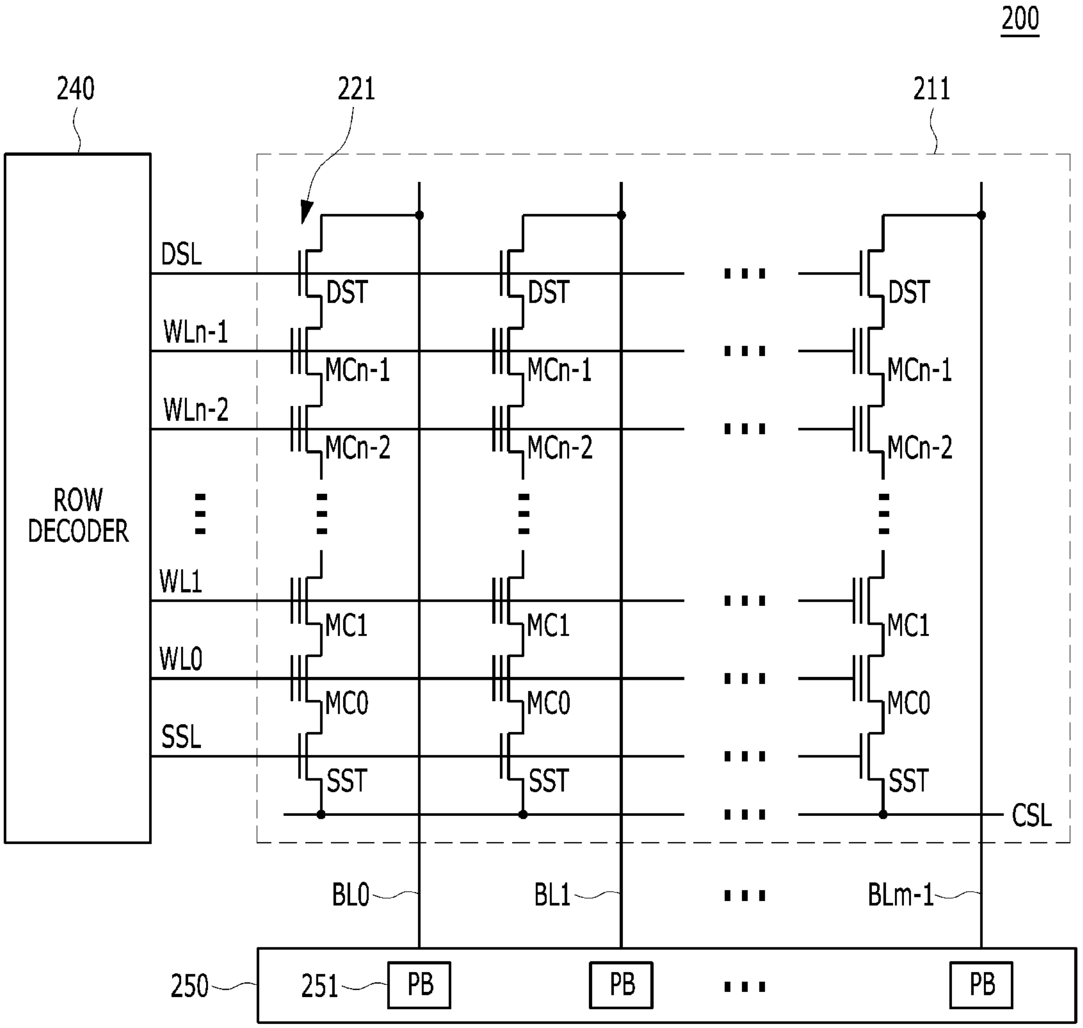
FIG. 2 is a circuit diagram illustrating a memory block of a memory device in accordance with still another embodiment of the present invention.

The memory device 200 as shown for example in FIG. 2 may in the simulations comprise a memory cell array 210, a control circuit 220, a voltage generation circuit 230, a row decoder 240, a page buffer 250 which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform program, read, or erase operations of the memory cell array 210. The control circuit 220 may control the peripheral circuit.

The voltage generation circuit 230 in the simulations may generate operational voltages of various levels. For example, in an erase operation, the voltage generation circuit 230 may generate operational voltages of various levels such as an erase voltage and a pass voltage.

The row decoder 240 in the simulations may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
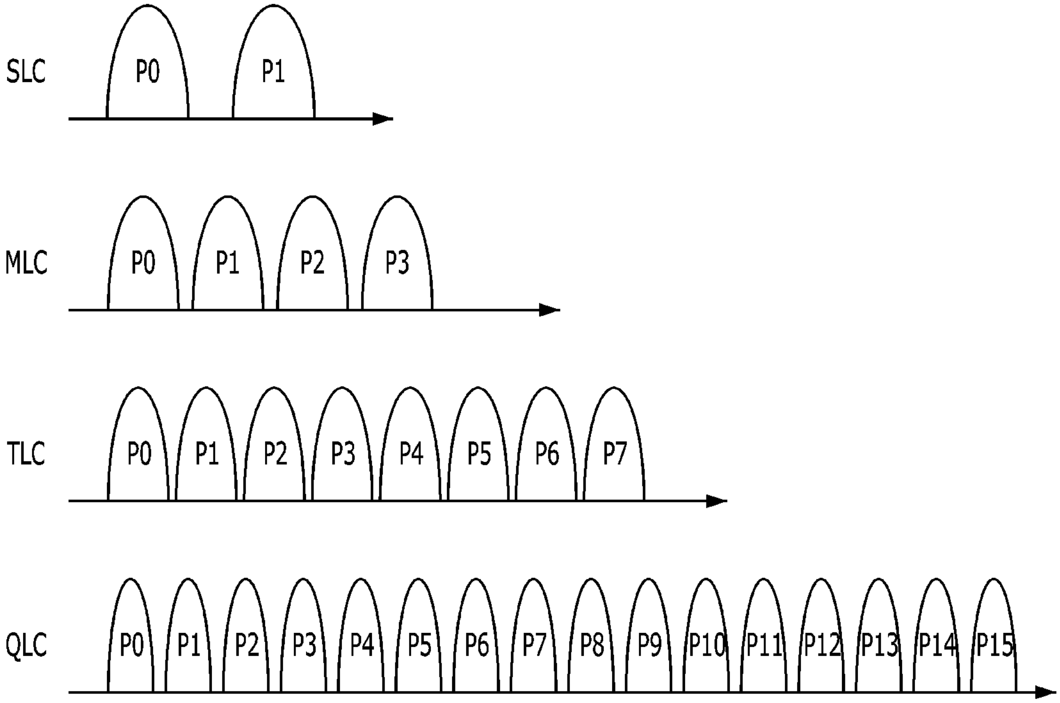
FIG. 3 is a diagram illustrating distributions of states for different types of cells of a memory device in accordance with one embodiment of the present invention.

The page buffer 250 in the simulations may be coupled with the memory cell array 210 through bit lines BL (shown in FIG. 3). The page buffer 250 may precharge the bit lines BL with a positive voltage, transmit data to and receive data from, a selected memory block in program and read operations, or temporarily store transmitted data in response to page buffer control signal(s) generated by the control circuit 220.

The column decoder 260 in the simulations may transmit data to and receive data from the page buffer 250 or may transmit and receive data to and from the input/output circuit 270.

The input/output circuit 270 in the simulations may transmit to the control circuit 220 a command and an address, received from an external device (e.g., the memory controller 100 of FIG. 1), transmit data from the external device to the column decoder 260, or output data from the column decoder 260 to the external device through the input/output circuit 270.

The control circuit 220 in the simulations may control the peripheral circuit in response to the command and the address.

FIG. 2 is a circuit diagram illustrating a memory block of a semiconductor memory device in accordance with still another embodiment of the present invention. For example, the memory block of FIG. 2 may be any of the memory blocks 211 of the memory cell array 210 shown in FIG. 1.

Referring to FIG. 2, the memory block 211 in the simulations may include a plurality of word lines WL0 to WLn−1, a drain select line DSL, and a source select line SSL coupled to the row decoder 240. These lines may be arranged in parallel, with the plurality of word lines between the DSL and SSL.

The memory block 211 in the simulations may further include a plurality of cell strings 221 respectively coupled to bit lines BL0 to BLm−1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn−1 may be serially coupled between the selection transistors DST and SST. Each of the memory cells may be formed as a multiple level cell. For example, each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string in the simulations may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 in the simulations may include a plurality of page buffers 251 that are coupled to the bit lines BL0 to BLm−1. The page buffers 251 may operate in response to page buffer control signals. For example, the page buffers 251 may temporarily store data received through the bit lines BL0 to BLm−1 or sense voltages or currents of the bit lines during a read or verify operation.

In various embodiments of the present invention, the memory blocks 211 in the simulations may be a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

FIG. 3 is a diagram illustrating distributions of states or program voltage (PV) levels for different types of cells of a memory device in accordance with one embodiment of the present invention.

Referring to FIG. 3, each of the memory cells in the simulations may be implemented with a specific type of cell, for example, a single level cell (SLC) storing 1 bit of data, a multi-level cell (MLC) storing 2 bits of data, a triple-level cell (TLC) storing 3 bits of data, or a quadruple-level cell (QLC) storing 4 bits of data. Usually, all memory cells in a particular memory device are of the same type, but that is not a requirement.

An SLC in the simulations may include two states P0 and P1. P0 may indicate an erase state, and P1 may indicate a program state. Since the SLC can be set in one of two different states, each SLC may program or store 1 bit according to a set coding method. An MLC may include four states P0, P1, P2 and P3. Among these states, P0 may indicate an erase state, and P1 to P3 may indicate program states. Since the MLC can be set in one of four different states, each MLC may program or store two bits according to a set coding method. A TLC may include eight states P0 to P7. Among these states, P0 may indicate an erase state, and P1 to P7 may indicate program states. Since the TLC can be set in one of eight different states, each TLC may program or store three bits according to a set coding method. A QLC may include 16 states P0 to P15. Among these states, P0 may indicate an erase state, and P1 to P15 may indicate program states. Since the QLC can be set in one of sixteen different states, each QLC may program or store four bits according to a set coding method.

Referring back to FIGS. 1 and 2, the memory device 200 in the simulations may include a plurality of memory cells (e.g., NAND flash memory cells). The memory cells are arranged in an array of rows and columns as shown in FIG. 2. The cells in each row are connected to a word line (e.g., WL0), while the cells in each column are coupled to a bit line (e.g., BL0). These word and bit lines are used for read and write operations. During a write operation in the simulations, the data to be written ('1' or '0') is provided at the bit line while the word line is asserted. During a read operation in the simulations, the word line is again asserted, and the threshold voltage of each cell can then be acquired from the bit line. Multiple pages may share the memory cells that belong to (i.e., are coupled to) the same word line. When the memory cells are implemented with MLCs, the multiple pages include a most significant bit (MSB) page and a least significant bit (LSB) page. When the memory cells in the simulations are implemented with TLCs, the multiple pages include an MSB page, a center significant bit (CSB) page and an LSB page. When the memory cells in the simulations are implemented with QLCs, the multiple pages include an MSB page, a center most significant bit (CMSB) page, a center least significant bit (CLSB) page and an LSB page. The memory cells may be simulated for example using a coding scheme (e.g., Gray coding) in order to increase the capacity of the memory system 10 such as SSD.

Simulation Platform

In one embodiment of the present invention, simulation platform 15 may find weak points and improvements of FW algorithms by running simulations as to predicted responses (e.g., time to failure of memory blocks with or without wear leveling) that would occur given the attributes of the existing memory at the start of the simulation. In one embodiment of the present invention, simulation platform 15 provides flexibility in simulating component configurations according to the needs at different stages of product development and provides flexibility for testing actual devices.

Referring back to FIG. 1, if a simulation is made for a host requesting a storage device (such as memory system 10) to write or read information by passing information on the data size and the addresses of the information to be written or read, in the simulation, the storage device may perform internal read and write operations for optimizing storage volume, preventing/resolving NAND readability issues, updating logical to physical address mapping, etc. Accordingly, simulation platform 15 can predict how to optimize storage volume, prevent/resolve NAND readability issues, and update logical to physical address mapping as the simulation platform 15 simulates the host request operation and gathers information for future analyses.

Figure 5:
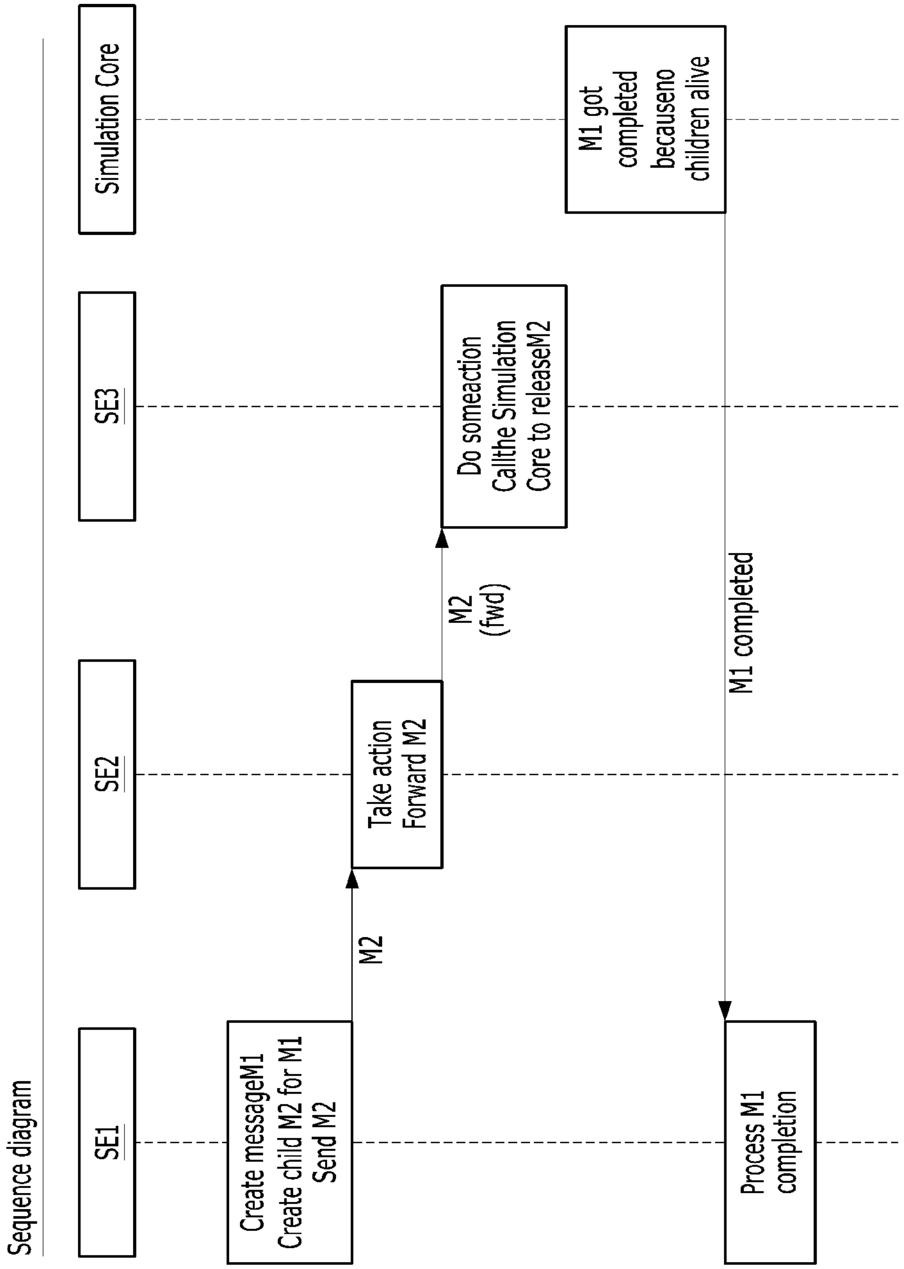
FIG. 5 is a sequence diagram in accordance with yet another embodiment of the present invention.

FIG. 5 is a diagram illustrating a simulation platform 15 in accordance with another embodiment of the present invention. To provide SEs graph traversing and fast communication between simulated HW/FW components (fast relative to that of actual hardware and firmware components), in one embodiment of the present invention, simulation platform 15 stores in repository 52 a set of SEs (shown in FIG. 5 as device1 SE, device2 SE, device3 SE, device4 SE) where each SE is an algorithmic implementation of some HW or FW component related to a specific product or group of products or/and specific algorithm revision.

In graph traversing, a graph represents a non-linear data structure that consists of nodes and their connected edges. More specifically, the graph is a structure amounting to a set of objects in which some pairs of the objects are "related" to each other (for example by a functional dependence). The objects correspond to mathematical abstractions called vertices (also called nodes or points), and each of the related pairs of vertices is referred to as an edge. The simulation core composes the SE graphs and dispatches messages between SEs. Graph traversal is a technique used for a searching a vertex in the graph.

Simulation platform 15 also includes a simulation core engine 54 which is programmed to: perform simulation, redirect messages to corresponding SEs, manage a sequence of SEs being called up for simulation, and calculate target metrics (e.g., latency, throughput, write amplification index, etc.). Simulation platform 15 also includes an SEs relation manager processor 56. This tool is programmed to build a graph of SEs (from a set of SEs being called up for simulation) with the graph showing edges according to a target simulation purpose and product.

The graph generated by simulation core engine 54 can be implemented as a file with a suitable format generated by a predefined script. The graph provides the SEs relationship for use by the simulation core. The graph (if depicted to a user) provides the user a visual tool for showing the selected SEs and a logical relationship between the functions of the SEs. Simulation platform 15 also stores in repository 58 one or more product configuration files which contain parameters and their values for target product simulation(s). If FW already has a configuration file, this file can be used directly for simulation, or required parameters can be automatically gathered from FW code directly by simulation platform 15.

In one embodiment of the present invention, the SEs in the simulations function as a message-driven system under control of a simulation core engine (such as simulation core engine 54 in FIG. 4) generates messages for example according to a predefined workload. A predefined workload implemented by a SE may represent established workload types such as random or sequential data reading. A predefined workload may also represent different data directions, read or write or combination of thereof with various queue depths. As an example, a workload for a combination like random read write may have a 70% write probability with a 4 k memory block size and queue depth of 32 commands.

In one embodiment of the present invention, a message representing data is sent to a specific address. In message driven systems, each component may have a unique "address" that other components can send messages to. Each of these SE components, or recipients, awaits messages and reacts to the received message. In one embodiment of the present invention, message driven simulation constitutes a simulation where SEs interact with each other via sending messages. The "addresses" correspond to the above noted graph edges. Such message-driven simulations can reconcile conflicting requirements of isolated models, facilitate simulation core, and highly correlate tempo of the pace of simulation. In one embodiment of the present invention, the HW and FW of a storage device controller are designed as interacting SE components, and can be represented as a graph. This graph reflects HW and FW cooperation. In one embodiment of the present invention, a storage device is functionalized as a graph of independent simulation entities (ISEs) where every ISE is an algorithmic implementation of a HW or FW component. In one embodiment of the present invention, the SEs interact with each other via sending messages, which correspond to graph edges. In FIG. 5, for example, there are two (2) edges SE1-SE2 and SE2-SE3.

In one embodiment of the present invention, simulation core engine 54 is responsible for composing the SEs graph and dispatching messages between SEs. For example, a simulation core may obtain a graph. The graph can be a file or some other entity (such as an object). The simulation core creates SEs entities and manages relations between the SEs according to the obtained graph during simulation by dispatching messages between SEs.

In one embodiment of the present invention, the simulation graphs may be generated from a script (i.e., a separate application) which creates a graph or the graphs may be generated by a user. For a particular simulation (for instance for a specific SSD), a particularized graph can be generated as a base or template. Regardless of generation, changes to the graph(s) can be made.

As an ISE, any HW/FW simulation entity may be added/removed or replaced with other version(s) without affecting the remaining simulation entities. Since the SEs can be independent of each other, the number of graph nodes can be flexibly changed. This flexibility permits the making of more or less detailed simulations. This message driven attribute permits the SEs to be independent of each other, as message sending is the only way of interaction with the receiving SE having no regard for where the message originated.

Simulation platform 15 shown in FIG. 4 in one embodiment can function as a standalone simulator. Alternatively, simulation platform 15 shown in FIG. 4 in another embodiment can function to accept inputs from real existing hardware and firmware components in an actual product.

In a real storage device, any internal operation (e.g., execution of FW code, NAND operation, access to RAM, HW engine working, etc.) requires time to be executed. The duration of a storage device internal operation can differ from nanoseconds (for access to RAM) to milliseconds (for NAND operation). While the duration of some of the operations can be constant, others distributed over time. Due to these considerable differences in the internal operation durations, it is not often necessary to simulate all drive HW/FW components for target metric in order to obtain an acceptable accuracy level. Accordingly, storage device components are distinct on a time-consuming criterion. Such criterion is reflected in simulation platform 15 by the following types of SEs:

1. Step Entity represents a time-consuming storage device component. Step Entity simulates various delays in HW. Step Entity accepts messages and reports a corresponding delay to the Simulation Core to simulate HW overhead.
2. State Entity simulates FW/HW state machines. Such SEs are simulated at once. A switch of state for the State Entity instructs simulation core engine 54 to perform the simulation immediately with no overhead simulated. State Entities interact via sending messages to other State and Step Entities.
3. Shared resources represent FW/HW algorithms. Such SEs typically do not consume substantial simulation time. All the shared resources may be simulated at once. The SEs do not consume a substantial amount of simulation time. Shared resources can be shared between other SEs but may not be allowed to send or receive messages. The key requirement is that a delay of algorithm execution does not affect the target metric.

Regardless of the types of SEs, messages are the preferred way for SEs to interact with each other. To send a new message, an SE allocates a message from the simulation core by calling on a simulation core engine 54 to send the message to another SE. The simulation core may have an application program interface (API) for handling messages. The SEs can use the simulation API as a function call to allocate, send, or release a message. An SE releases a message once the related operation is completed and may send feedback to the caller once the message is processed if it is required. A SE may call the simulation core API to release the message, meaning that the message does not belong to the SE any more as the SE has completed the operation/simulation that it was directed to do.

In one embodiment of the invention, a parent-child message relationship is utilized. The simulation core engine 54, by tracking all the messages released and allocation requests, puts a parent message into the corresponding SE's completion queue once all of the SE's child messages are released. From an architectural point of view, the parent-child relationship feature represents the causal relationship of the processes occurring inside the storage device and can be tracked and/or visualized. Accordingly, in one embodiment of the invention, there are two ways of sending messages between SEs:

Parent-Child Relationship (PCR) is used when an SE requires knowledge about a message released by another SE to do corresponding actions.

Forwarding (FWD) is used when there is nothing to do for an SE after message release. This FWD capability reduces the number of times that SEs call the simulation core engine 54, which leads to simulation performance improving.

Assume there are three SEs selected by a user at the SEs relation manager processor 56, where only SE1 generates initial messages and requires feedback about message completion, SE2 does some actions and forwards income messages further, SE3 does some actions and releases income messages. SE1 uses the parent-child relationship for sending message, so it is called by Simulation Core when a child is released. Because SE2 uses message forwarding there is no need for Simulation Core to call SE2 on message release.

FIG. 5 is a sequence diagram in accordance with yet another embodiment of the present invention. The sequence diagram shows a progression of messages in a parent-child progression where the initial or parent message M1 (e.g., to write data from a host to a memory) generates a second message M2 (e.g., to request acknowledgement that a memory block is available) which is sent to the second SE. A parent-child relationship reduces the time for processing SEs communication. The second SE takes action and forwards M2 onward to a third SE. As shown in FIG. 5, at some point in this sequence of events, there is no child message alive, and when no child message is alive, a call is made to simulation core (simulation core engine 54) to begin simulation based on the set of SEs and message M1 is processed.

For example, let message A have two child messages named B1 and B2 (which means that in order to complete message action, actions B1 and B2 must be completed). Action B1 is alive until the SE obtains a message that action B1 is done. Once the action B1 is done, message B1 is released. Once the message B1 is released it is not alive anymore. The same process follows for message B2. As soon as all actions are complete (i.e., B1 and B2 are released), the message A action is completed, and the SE component which owned or originated message A knows that all activities related to A have been completed.

Figure 7A:
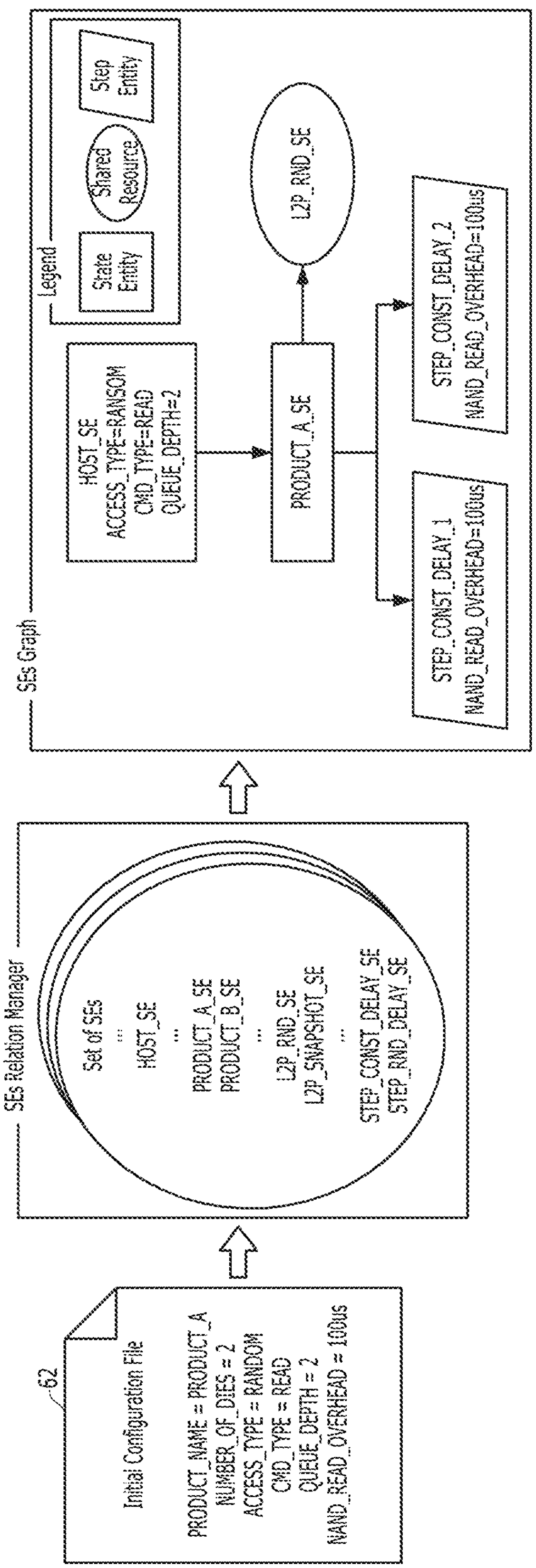
FIG. 7A is a diagram illustrating the building of a graph showing the logical relationships of different simulation entities in accordance with still another embodiment of the present invention.

In another example, if message M1 were an instruction to write data from a host to PRODUCT_A, then once the five SEs shown on the SEs graph in FIG. 7A had been selected with their attributes passed to simulation core engine 54, message M2 in FIG. 5 would be released, meaning that the action (here in this case the simulation of writing data to PRODUCT_A associated with message M2) is complete, and other actions can be undertaken form the SE.

Figure 6:
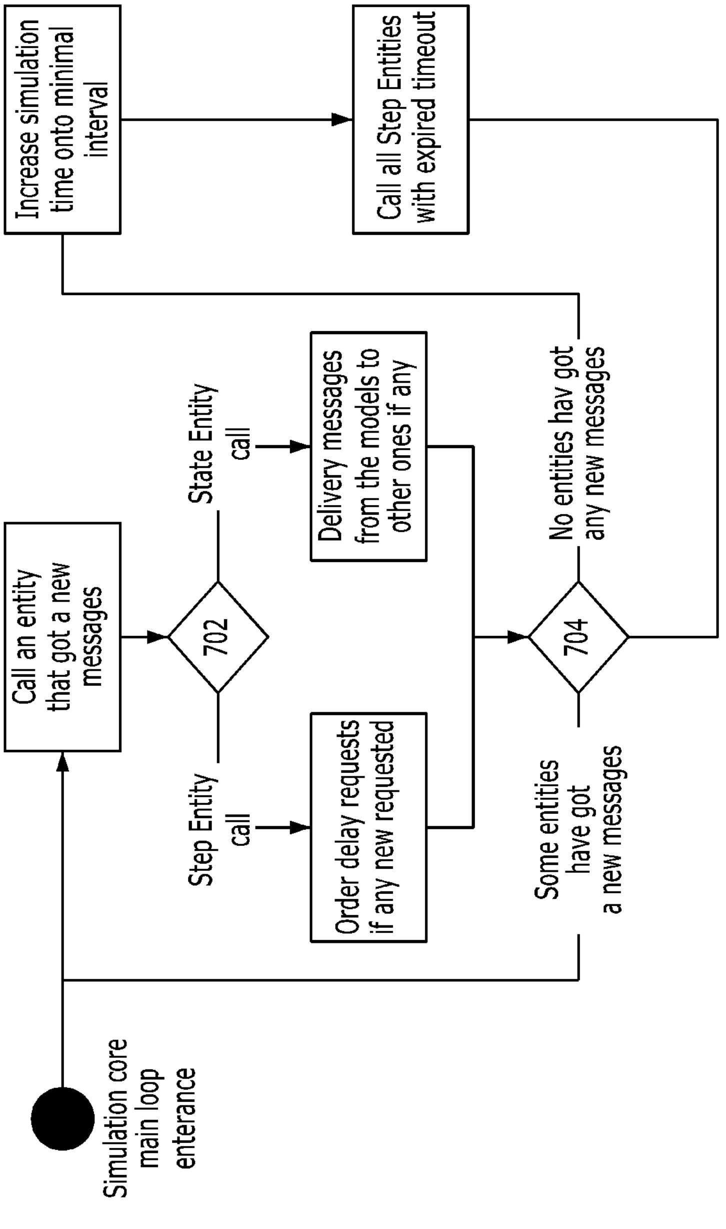
FIG. 6 is a diagram depicting a simulation core main loop.

FIG. 6 is a diagram depicting a simulation core main loop. To increase simulation performance, simulation core engine 54 may utilize (on its main loop iteration) an SE only in case it is required, e.g., there is an incoming/completed message for SE or time out defined by a Step Entity is expired. As illustrated in FIG. 6 in the main loop, simulation core engine 54 can call an entity to be used for simulation that had received a new message by selecting the appropriate SE from repository 52. In the main loop, branch point 702 decides if the simulation entity called is a step entity or a state entity (as detailed above). If the simulation entity is a step entity, simulation core engine 54 orders delay request(s). If the simulation entity is a state entity, simulation core engine 54 delivers messages to other state entities for actions that need to be simulated. At branch 704 in the main loop, simulation core engine 54 decides if any entities have new messages. In the case of new messages, simulation core engine 54 returns to the top of the main loop to call new entities for simulation. In the case of no new messages, simulation core engine 54 proceeds to increase simulation time and may call a step entity if there is an expired timeout.

Simulation core engine 54 may have no internal simulation time slice. Instead, the simulation time is often determined by the Step Entities themselves. Simulation core engine 54 picks up the minimal delay requested by Step Entities on the simulation loop. This strategy minimizes the cost to switch between SEs and simplifies the simulation of parallel processes.

In one embodiment of the present invention, when simulating a process, the simulation steps are synchronized by the SEs in order to know when subsequent actions are to be taken. The software simulation may in effect use different slices of real time (as determined by the SEs) for prompts and reminders for when subsequent actions are to occur without necessarily being tied to a time schedule determined by a physical clock. In other words, the SEs determine the simulation schedules.

FIG. 7A is a diagram illustrating the building of a graph showing the logical relationships of different simulation entities in accordance with still another embodiment of the present invention. Assume that the target metric for simulation is host read command latency for queue depth 2 random read-only workload. Also, assume that target SSD (with the product name "A") has only two NAND dies and all Host and storage device HW overheads to process Host cmd equal 0 except NAND overheads.

As shown in FIG. 7A, an initial configuration file brings in attributes of a memory system to be simulated. As shown in the example depicted in FIG. 7A, a host SE, two product SEs, two logical to physical address mapping SEs, and two step delay SEs may be available for selection. A user interacting with SEs relation manager processor 56 then selects from repository 52 those SEs to be used in the simulation. As noted above, a graph of the SEs (from the set of SEs being called up for simulation) is built as shown on the right side of FIG. 8 with the assistance of a user where a host SE with its attributes (access-type, command type, queue depth), a product SE, and a L2P SE are shown in the SE graph of FIG. 7A along with the step delay SEs. In the illustrated example, the graph shows the flow of communications from one SE to another.

In the illustrated simulation being setup in FIG. 7A, a host is represented by State Entity "HOST_SE," because all HW overheads are excluded and, the state entity "HOST_SE" would preferably only generate commands according to a specified workload (as noted above) and send it further. On FIG. 7A, target storage device components are represented as a single State Entity with the name "PRODUCT_A_SE", because there are no other HW overheads except NAND overhead. The main purpose of the "PRODUCT_A_SE" State Entity is to redirect an incoming message to a corresponding storage device die component represented as one of Step Entity with constant delay ("STEP_CONST_DELAY_1" or "STEP_CONST_DELAY_2") with defined overhead for read operation defined in Initial Configuration File. For operation redirection, "PRODUCT_A_SE" State Entity may use Shared Resource SE "L2P_RND_SE", which simulates logical address to physical address translation table (L2P). In the illustrated example, "L2P_RND_SE" is a random number generator to randomly select a target die for a model. With the help of SEs Relation Manager 56, a user can replace "L2P_RND_SE" with L2P_SNAPSHOT_SE (or other existing/new Shared Resource for L2P simulation), which can be a snapshot of the attributes of L2P from a real drive after a precondition.

Assume that the simulation of access to DRAM to read L2P table is required for the simulation to increase its accuracy of Host read command latency projection. Also, assume that DRAM read overhead is known and has a constant value. In this case, with the help of SEs Relation Manager 56, a user can reconfigure the SEs graph to that shown in FIG. 7B. This reconfiguration (appearing as the difference between the SE graphs in FIG. 7A and FIG. 7B) is one important aspect of simulation platform 15.

The main difference compared with the initial configuration shown in FIG. 7A is the adding of one more Step Entity "STEP_CONST_DELAY_3" to simulate DRAM read access with corresponding overhead. Also, for the new simulation, PRODUCT_A_SE State Entity firstly sends income message to "STEP_CONST_DELAY_3" for simulation of physical address reading overhead and only after the overhead expiration sends the corresponding message to correspond SE responsible for NAND die read overhead simulation.

Figure 7B:
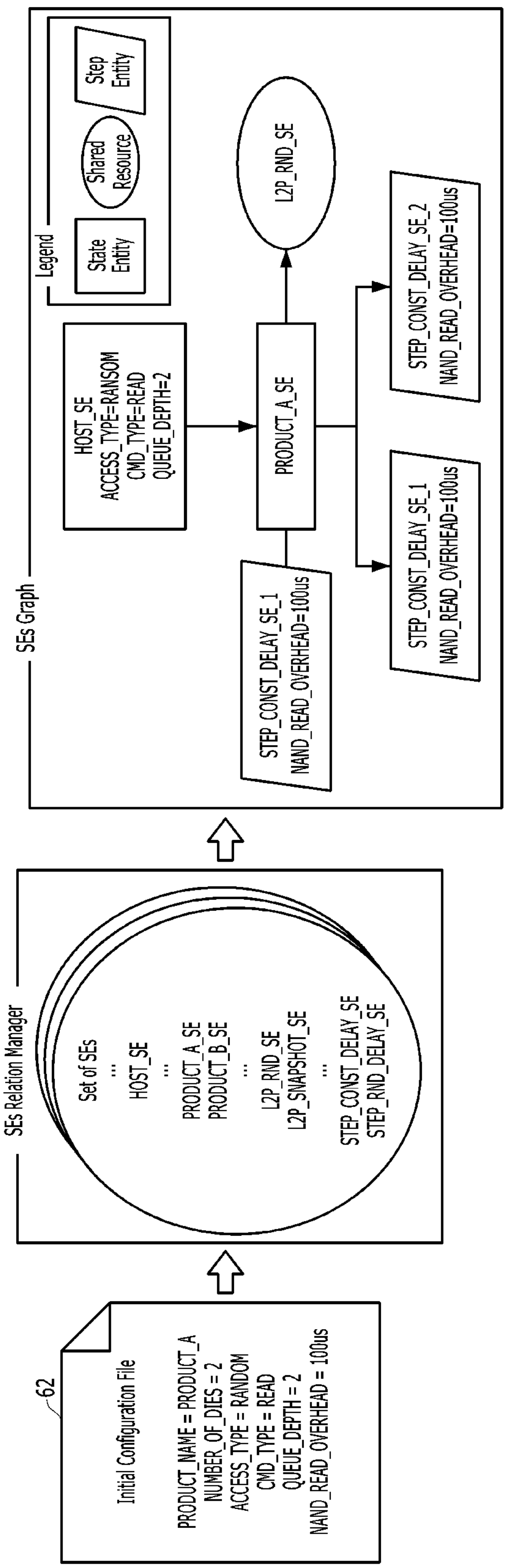
FIG. 7B is a diagram illustrating another graph modified for a specific simulation.
Figure 8:
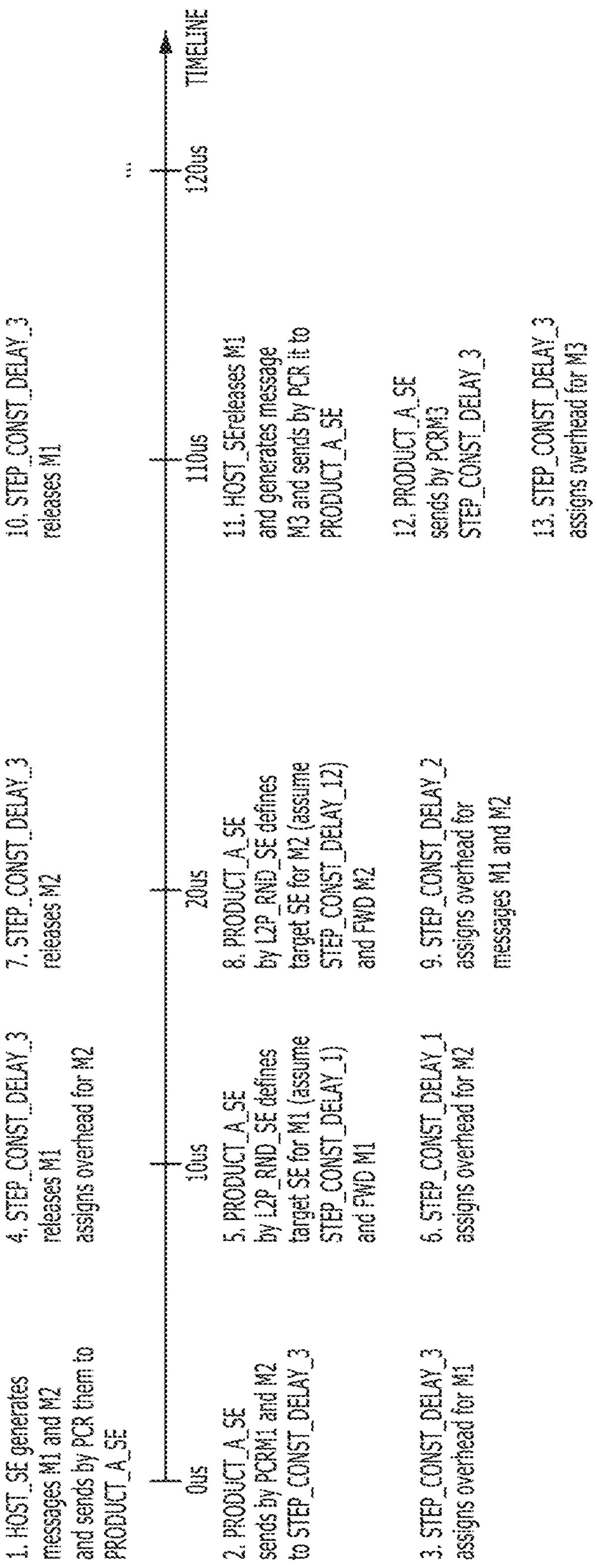
FIG. 8 is a timing diagram illustrating.

FIG. 8 shows a SEs call sequence (in time) made by simulation core engine 54 during a simulation of the configuration shown in the SE graph of FIG. 7B (the time scale is denoted). With the help of PCR or FWD sending (detailed above), at each time point, simulation core engine 54 calls only the required SEs for the simulation (i.e., those selected by user through SEs relation manager 56.) In the order shown in FIG. 8, first, HOST_SE (through the simulation core engine 54 processing the program code of HOST_SE) generates messages M1 and M2 and sends by PCR them to PRODUCT_A_SE. Second, PRODUCT_A_SE (through the simulation core engine 54 processing the program code of PRODUCT_A_SE) sends by PCR M1 and M2 to STEP_CONST_DELAY_3. Third, STEP_CONST_DELAY_3 (through the simulation core engine 54 processing the program code of STEP_CONST_DELAY_3) assigns overhead (memory resources) for acting on the action of M1. Fourth, STEP_CONST_DELAY_3 (through the simulation core engine 54 processing the program code of STEP_CONST_DELAY_3) releases M1 and assigns overhead (memory resources) for acting on the action of M2. Fifth, PRODUCT_A_SE by L2P_RND_SE (through the simulation core engine 54 processing the program code of PRODUCT_A_SE and L2P_RND_SE) defines a target simulation for the action of M1 and forwards message M1. Sixth, STEP_CONST_DELAY_1 assigns overhead (memory resources) for acting on the action of M2. Seventh, STEP_CONST_DELAY_3 releases message M2. Eighth, PRODUCT_A_SE by L2P_RND_SE (through the simulation core engine 54 processing the program code of PRODUCT_A_SE and L2P_RND_SE) defines a target simulation for the action of M2 and forwards message M2. Ninth, STEP_CONST_DELAY_2 assigns overhead (memory resources) for acting on the action of M1 and M2. Tenth, STEP_CONST_DELAY_3 releases message M1. Eleventh, HOST_SE (through the simulation core engine 54 processing the program code of HOST_SE) releases M1 and generates message M3 and sends M3 to PRODUCT_A_SE. Twelveth, PRODUCT_A_SE (through the simulation core engine 54 processing the program code of PRODUCT_A_SE) sends message M3 to STEP_CONST_DELAY_3. Thirteenth, STEP_CONST_DELAY_3 (through the simulation core engine 54 processing the program code of PRODUCT_A_SE) assigns overhead (memory resources) for acting on the action of message M3.

In one embodiment of the present invention, configurability is provided by the product configuration files and related tools such as the SEs relation manager processor 56. Using the file(s), a user can simply change a value of an HW/FW component parameter before running another simulation. In one embodiment of the present invention, scalability is provided by SEs independence and its modular composition. The SEs relation manager processor 56 permits a user by aid of a graph to include or exclude SEs according to a required level of accuracy. In one embodiment of the present invention, simulation performance is provided by an efficient sequence of SEs being called up such that the simulation only uses SEs which affect a target metric for estimation. For example, from previous simulations, documentation, theory or assumption, SEs which are “known” to affect the target metric are selected, thereby facilitating the modelling by selection of “better” SEs for the target metric in question to be modelled.

In one embodiment of the present invention, a simulation system (or platform) for storage device simulation is provided. Here, a simulation system (such as for example simulation system 2) comprises a set of simulation entities (SEs) including a host SE and storage component SEs corresponding to hardware and software components of a storage device to be simulated (such as for example repository 52). In this embodiment, the simulation system further includes a) a relation manager processor (such as for example SEs relation manager processor 56) configured to determine a logical relationship between selected SEs from the set of the SEs and b) a simulation core engine (such as core engine 54) configured to perform simulations using the selected (or called up for simulation) SEs. In this embodiment, sequential messages propagate between the selected SEs and to the simulation core engine. The sequential messages determine whether conditions for a simulation are complete (and therefore determine when a simulation is to be made).

In one embodiment of the present invention, the simulation core engine is configured to create for a first SE of the selected SEs a first message and a second message, and the second message is forwarded to a second SE of the selected SEs.

In one embodiment of the present invention, the simulation core engine simulating the second SE performs at least one simulated action based on the second message, the simulation core engine forwards the second message to a third SE of the selected SEs, the simulation core engine simulating the third SE performs another simulated action based on the second message and releases the second message, and the simulation core engine completes the simulation in response to the release of the second message.

In one embodiment of the present invention, the SEs comprise independent SEs which can be exchanged for different simulations without affecting operation of other SEs. In another embodiment, the sequential messages may have a parent-child relationship with a child message generated in response to a previously generated parent message.

In one embodiment of the present invention, the system may include a repository of configuration files (such as for example repository 58), with the configuration files storing information about attributes of different hardware and software components for different storage devices. Relation manager processor 56 may be configured to build a graph depicting the logical relationship between the selected SEs. The graph may be built by loading configuration information from the configuration files and loading the selected SEs. Further, relation manager processor 56 may be configured to provide a user a visual depiction of the selected SEs, the logical relationship between the selected SEs, and the configuration information. Relation manager processor 56 may be configured to accept user input for selection of the SEs and for selection of the configuration files.

Figure 9:
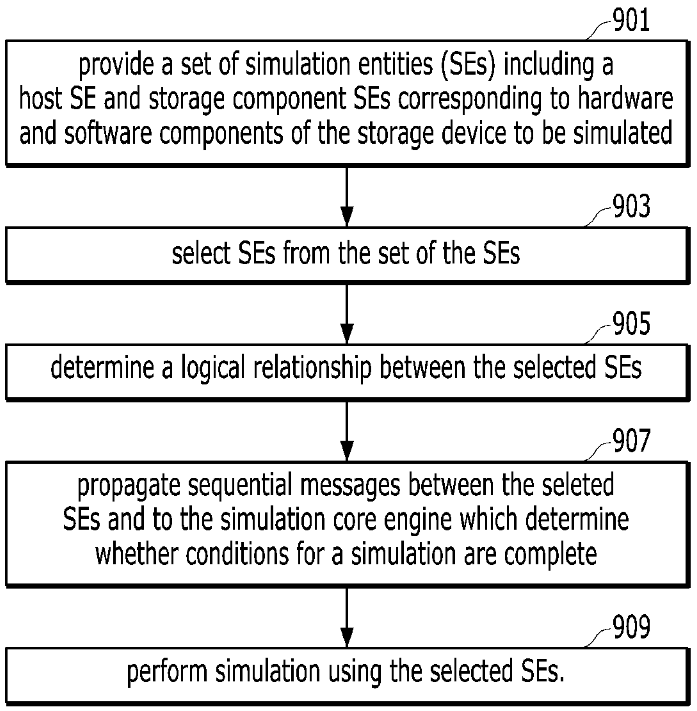
FIG. 9 is a diagram illustrating a simulation operation in accordance with another embodiment of the present invention.

FIG. 9 is a diagram illustrating a simulation operation in accordance with another embodiment of the present invention.

As depicted in FIG. 9. the method at 901 provides a set of simulation entities (SEs) including a host SE and storage component SEs corresponding to hardware and software components of the storage device to be simulated. The method at 903 selects SEs from the set of the SEs. The method at 905 determines a logical relationship between the selected SEs. The method at 907 propagates sequential messages, between the selected SEs and to the simulation core engine, which determine whether conditions for a simulation are complete (and thus also determine when a simulation is to be made). The method at 909 performs simulations using the selected SEs.

In this method, propagating sequential messages comprises: communicating with the simulation core engine to create a first message and a second message for a first SE of the selected SEs, and sending the second message to a second SE of the selected SEs. This method further forwards the second message to a third SE of the selected SEs after the second SE takes at least one simulated action based on the second message, releases the second message after the third SE takes another simulated action based on the second message, and completes the simulation in response to the release of the second message.

In this method, the storage component SEs can be independent SEs which can be exchanged (for different simulations) without affecting other SEs. In this method, the messages propagating can be sequential messages having a parent-child relationship with a child message generated in response to a previously generated parent message. In this method, a repository of configuration files can be stored and accessed. The configuration files have information about attributes of different hardware and software components of different storage devices.

This method can further build a graph depicting the logical relationship between the selected SEs. Building the graph can involve loading configuration information from the configuration files. In this method, a visual depiction of the selected SEs, the logical relationship between the selected SEs, and the configuration information can be presented to a user, and the user may provide input (which is accepted) for selection of the SEs and for selection of the configuration files.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives of the disclosed embodiment. Furthermore, the disclosed embodiments may be combined to form additional embodiments.

Indeed, implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations, one or more features from a combination can in some cases be excised from the combination, and the combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A simulation system comprising:

a set of simulation entities (SEs) including a host SE and storage component SEs corresponding to hardware and software components of a storage device to be simulated;

a first repository storing the set of the SEs;

a relation manager processor configured to a) display to a user the set of the SEs, b) receive user input to select the SEs from the set of the SEs to use in the simulation system and to select configuration files to use in the simulation system, and c) determine a logical relationship between the selected SEs from the set of the SEs; and a simulation core engine configured to perform simulations using the selected SEs, wherein sequential messages are propagated between the selected SEs and to the simulation core engine whereby attributes of the selected SEs are passed to the simulation core engine, wherein the sequential messages define a parent-child relationship in which one or more child messages are generated in response to a previously generated parent message, and wherein at an end of messaging conditions for beginning a simulation are satisfied based on release of all of the one or more child messages and a call is made to the simulation core engine to begin the simulation.

2. The system of claim 1, wherein the simulation core engine is configured to create for a first SE of the selected SEs a first message and a second message, and the second message is forwarded to a second SE of the selected SEs.

3. The system of claim 2, wherein the simulation core engine simulating the second SE performs at least one simulated action based on the second message, the simulation core engine forwards the second message to a third SE of the selected SEs, the simulation core engine simulating the third SE performs another simulated action based on the second message and releases the second message, and the simulation core engine completes the simulation in response to the release of the second message.

4. The system of claim 1, wherein the storage component SEs comprise independent SEs which can be exchanged for different simulations without affecting other SEs of the storage component SEs.

5. The system of claim 1, further comprising a second repository of the configuration files, wherein the configuration files have information about attributes of different hardware and software components of different storage devices.

6. The system of claim 5, wherein the relation manager processor is configured to build a graph depicting the logical relationship between the selected SEs by loading configuration information from the configuration files and by loading the selected SEs.

7. The system of claim 1, wherein the relation manager processor is configured to build a graph depicting the logical relationship between the selected SEs.

8. The system of claim 7, wherein the relation manager processor is configured to provide the user with a visual depiction of the selected SEs, the logical relationship between the selected SEs, and configuration information.

9. The system of claim 7, wherein the relation manager processor is configured to accept the user input for selection of the SEs from the set of the SEs and for selection of the configuration files.

10. A method for simulating a storage device, comprising:

providing a set of simulation entities (SEs) including a host SE and storage component SEs corresponding to hardware and software components of the storage device to be simulated;

storing the set of the SEs in a first repository;

displaying to a user the set of the SEs;

receiving user input to select the SEs from the set of the SEs to use in the simulating and to select configuration files to use in the simulating;

determining a logical relationship between the selected SEs;

propagating sequential messages between the selected SEs and to a simulation core engine whereby attributes of the selected SEs are passed to the simulation core engine, wherein the sequential messages define a parent-child relationship in which one or more child messages are generated in response to a previously generated parent message and wherein at an end of messaging conditions for beginning a simulation are satisfied based on release of all of the one or more child messages, and a call is made to the simulation core engine to begin the simulation; and performing simulations using the selected SEs.

11. The method of claim 10, wherein the propagating sequential messages comprises:

communicating with the simulation core engine to create a first message and a second message for a first SE of the selected SEs; and sending the second message to a second SE of the selected SEs.

12. The method of claim 11, further comprising:

forwarding the second message to a third SE of the selected SEs after the second SE takes at least one simulated action based on the second message; and releasing the second message after the third SE takes another simulated action based on the second message, and completing the simulation in response to the release of the second message.

13. The method of claim 10, wherein the storage component SEs comprise independent SEs which can be exchanged for different simulations without affecting other SEs of the storage component SEs.

14. The method of claim 10, further comprising storing a second repository of the configuration files, wherein the configuration files have information about attributes of different hardware and software components of different storage devices.

15. The method of claim 14, further comprising building a graph depicting the logical relationship between the selected SEs comprises loading configuration information from the configuration files and loading the selected SEs.

16. The method of claim 10, further comprising building a graph depicting the logical relationship between the selected SEs.

17. The method of claim 16, further comprising visually depicting the selected SEs, the logical relationship between the selected SEs, and configuration information.

18. The method of claim 16, further comprising accepting the user input for selection of the SEs from the set of the SEs and for selection of the configuration files.

* * * * *